(12) United States Patent
Chen (10) Patent No.: US 8,258,777 B2
(45) Date of Patent: Sep. 4, 2012

(54) INDUCTIVE PROXIMITY SENSOR

(76) Inventor: Weihua Chen, Westford, MA (US)

( * ) Notice: Subject to any disclaimer, the term of this patent is extended or adjusted under 35 U.S.C. 154(b) by 579 days.

(21) Appl. No.: 12/554,658

(22) Filed: Sep. 4, 2009

(65) Prior Publication Data
US 2011/0057668 A1 Mar. 10, 2011

(51) Int. Cl.
*G01B 7/14* (2006.01)
*G01R 33/12* (2006.01)

(52) U.S. Cl. .............. 324/207.15; 324/207.16; 324/228; 324/655

(58) Field of Classification Search ............. 324/207.15, 324/207.26, 228, 655
See application file for complete search history.

(56) References Cited

U.S. PATENT DOCUMENTS

| | | | |
|---|---|---|---|
| 4,879,531 A | 11/1989 | Tigges et al. | |
| 5,034,704 A | 7/1991 | Tomioka et al. | |
| 5,264,733 A | 11/1993 | Tigges | |
| 5,410,488 A | 4/1995 | Andersen, III | |
| 6,335,619 B1 | 1/2002 | Schwab et al. | |
| 7,463,020 B2 | 12/2008 | Kühn | |
| 2005/0162158 A1 | 7/2005 | Del Monte | |

FOREIGN PATENT DOCUMENTS

| | | |
|---|---|---|
| JP | 2009-128355 A | 6/2009 |
| WO | WO 2011/028577 A2 | 3/2011 |

OTHER PUBLICATIONS

Notification of Transmittal of the International Search Report and the Written Opinion of the International Searching Authority for Int'l Application No. PCT/US2010/046660; Date Mailed: Apr. 25, 2011.

*Primary Examiner* — Reena Aurora
(74) *Attorney, Agent, or Firm* — Hamilton, Brook, Smith & Reynolds, P.C.

(57) ABSTRACT

The present invention relates to an inductive proximity sensor that includes an oscillator having first and second inductor-capacitor circuits arranged such that an inductance of one of the inductor-capacitor circuits has substantially greater sensitivity to an external target than an inductance of the other inductor-capacitor circuit. The sensor also includes an alternating current drive to each of the inductor-capacitor circuits that is in-phase and depends on differences in voltage across the inductor-capacitor circuits. The sensor may be coupled to a calibration device that applies power and triggers a calibration routine within the sensor. In response to the trigger signal, a calibration processor within the sensor executes the calibration routine and adjusts the inductor-capacitor circuits and provides an indication of successful calibration.

12 Claims, 12 Drawing Sheets

INDUCTIVE PROXIMITY SENSOR

BACKGROUND

Inductive proximity sensors are often designed based on an eddy current killed oscillator (ECKO) principle. In such proximity sensors, an inductor-capacitor (LC) oscillator is used to generate an alternating current (AC) magnetic field adjacent to an electrical coil of the inductor such that when a metallic target approaches the coil, eddy current is induced in the target. The induced eddy current generates an energy loss that can damp or collapse the LC oscillator. An electronic circuit is often employed to detect changes of oscillation amplitude and compare the detected changes to a predetermined threshold. If the oscillator amplitude drops below the threshold level, the output of the proximity sensor is updated to indicate the presence of a target in the vicinity of the proximity sensor.

Inductive proximity sensors operating based on the ECKO principle are shown to have a number of drawbacks. For example, due to their high thermal sensitivity, these sensors may suffer from having short sensing distances. In fact, these sensors may have much shorter sensing distances for non-ferrous metal target in comparison to ferrous targets. Additionally, since inductive proximity sensors are not immune to outside magnetic fields, external magnetic fields may saturate the ferrite core used in the sensing coil and cause malfunction of these sensors. Inductive proximity sensors may also suffer from limited switching speed.

In order to achieve equal sensing distance for ferrous and non-ferrous metals, Tigges (U.S. Pat. No. 5,264,733) employs a transmitting coil along with two receiving coils to detect field disturbances in place of eddy current loss. As the operating frequency increases above a certain limit, ferrous and non-ferrous targets tend to affect the AC magnetic field similarly. As such, at sufficiently high operating frequencies, equal sensing distances for both ferrous and non-ferrous targets can be achieved. Tigges also achieves immunity to external magnetic fields by employing three air cores. However, since Tigges relies on relative displacement, mechanical geometry, and number of turns in the coils to set sensing distance, the sensing distance is not electrically tunable and may be prone to temperature drift due to thermal deformation of its mechanical parts. Additionally, since at least three coils are required to implement the transmitting and receiving coils, the physical implementation may be expensive.

Another multi-coil design based on transformer coupling principle is described by Kühn (U.S. Pat. No. 7,463,020). Kühn arranges all coils as concentric circles on the surface of a printed circuit board (PCB) and employs one transmitting coil and at least two receiving coils, along with a PCB to implement the coils, while attempting to ensure that the coupling factors among coils are stable and repeatable. The receiving coils are positioned on the same plane and as such the sensitivity of the sensor to a target may be relatively lower compared to other known methods in the art.

Yet another method for achieving equal sensing distances for ferrous and non-ferrous targets is described by Tigges et al. (U.S. Pat. No. 4,879,531). Tigges et al. employs an oscillator that includes two LC tanks. The first LC tank determines oscillating frequency. The second tank includes a sensing coil and is used to amplify the oscillator. In order to achieve equal sensing distances for both ferrous and non-ferrous metals, the resonant frequency of the first tank and the critical impedance value of the second tank are tuned to the coordinates of the point of intersection of the impedance frequency characteristics of the second tank, which is affected by ferrous and non-ferrous target respectively. However, Tigges method requires a complicated tuning process to achieve equal sensing distances. Additionally, thermal sensitivity may limit achievable sensing distances and the addition of the two coils may increase the cost of implementation.

Tomioka et al. (U.S. Pat. No. 5,034,704) also employs two LC tanks to achieve equal sensing distances for ferrous and non-ferrous metals. In implementation, Tomioka employs an oscillator circuit and as such has similar advantages and disadvantages as Tigges.

Mounting an inductive proximity sensor to a metallic material may result in shifting the sensing distance of a sensor or, in more extreme cases, locking the output of the sensor, resulting in sensor malfunction. Various shield design techniques have been introduced and implemented in the literature. Such methods include placement of a metallic ring around the sensing coil (i.e., passive approach) or use of a compensating coil (i.e., active approach). While such methods help build shielded or embeddable inductive proximity sensors having standard sensing distances, for sensors with extended sensing distances, the effectiveness of the shield design remains a major issue.

Due to their outstanding resistance to severe application environments (e.g., dirt, wetness, existence of chemical liquids, etc.), inductive proximity sensors are widely used. On-line calibration methods or learning mechanisms exist to compensate for influence of mounting material. Unfortunately, placement of adjustment buttons on a sensor body may reduce the seal rating of the sensor. In order to resolve this issue, some sensor designs employ a control box that connects to the sensor using a so-called "pig tail" cable connection. The control box includes control modules that are used to program the sensor and compensate for the influence of the mounting metallic material. However, the control box may significantly increase product cost. Additionally, once a sensor is installed, the calibration process may require the sensor to be powered up. Further, sensors using the control box calibration method may be accidentally re-calibrated, resulting in failure of the sensors during operation or service.

SUMMARY

An example embodiment of the present invention relates to a method and corresponding apparatus for an inductive proximity sensor including an oscillator that includes a first inductor-capacitor circuit and a second inductor-capacitor circuit, as well as an alternating current drive to each of the inductor-capacitor circuits. An inductance of one of the inductor-capacitor circuits is arranged to have a substantially greater sensitivity to an external target than an inductance in the other inductor-capacitor circuit. The drive to each of the inductor-capacitor circuits may be in-phase and depend on voltage differences across the inductor-capacitor circuits.

The inductor having lesser sensitivity to the external target may provide a positive feedback in the oscillator. The inductance having greater sensitivity to an external target may be of a coil and the inductance of lesser sensitivity may be of an inductor. The first inductor-capacitor circuit may be arranged between a non-inverting input of a differential amplifier and ground and the second inductor-capacitor circuit may be arranged between an inverting input of the differential amplifier and ground. At least one of the first and second inductor-capacitor circuits may include a sensing coil.

The voltage differences may be applied to a differential amplifier that controls currents flowing through each of the inductor-capacitor circuits. The voltage differences may be applied to control current in a current mirrored circuit that controls current to each of the inductor-capacitor circuits.

The inductive proximity sensor may also include a phase detector that identifies a ferrous target or a non-ferrous target as a function of determining a leading phase from among voltages across the inductor-capacitor circuits. The phase detector identifies a ferrous target or a non-ferrous target in an event the leading phase reaches a predetermined threshold.

The inductive proximity sensor may include a variable capacitor coupled to at least one of the inductor-capacitor circuits. The variable capacitor may be used to tune the inductor-capacitor circuits to approximately same resonant frequencies. The inductive proximity sensor may include a voltage control module that controls voltage across each of the inductor-capacitor circuits as a function of controlling current flowing to each of the inductor-capacitor circuits.

The proximity sensor may include a signal processing circuit that indicates presence and position of the external target as a function of detecting changes caused by the external target in at least one of oscillation amplitude or relative phase difference between the first and second inductor-capacitor circuits.

Another example embodiment of the present invention relates to a method and corresponding apparatus for calibrating an inductive proximity sensor including a sensor and a calibration device coupled to the sensor. The calibration device may be employed to apply power and trigger a calibration routine to the sensor. A calibration routine may be performed in the sensor using the power applied from the calibration device and an indication of successful calibration may be issued through the calibration device. The calibration routine may be applied as a function of generating a series of command pulses, the command pulses including a series of logic signals that initiate the calibration routine.

Yet another example embodiment of the present invention relates to a method and corresponding apparatus for an inductive proximity sensor including a sealed housing, a sensor circuit and a calibration processor. The sensor circuit includes an inductor-capacitor circuit and a calibration processor within the housing. The calibration processor may respond to an external trigger signal to run a calibration routine, adjust the inductor-capacitor circuit, and provide an indication of successful calibration. The inductive proximity sensor may include a calibration device coupled to the sensor that applies power and triggering the calibration routine.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of example embodiments of the invention follows.

Figure 1:
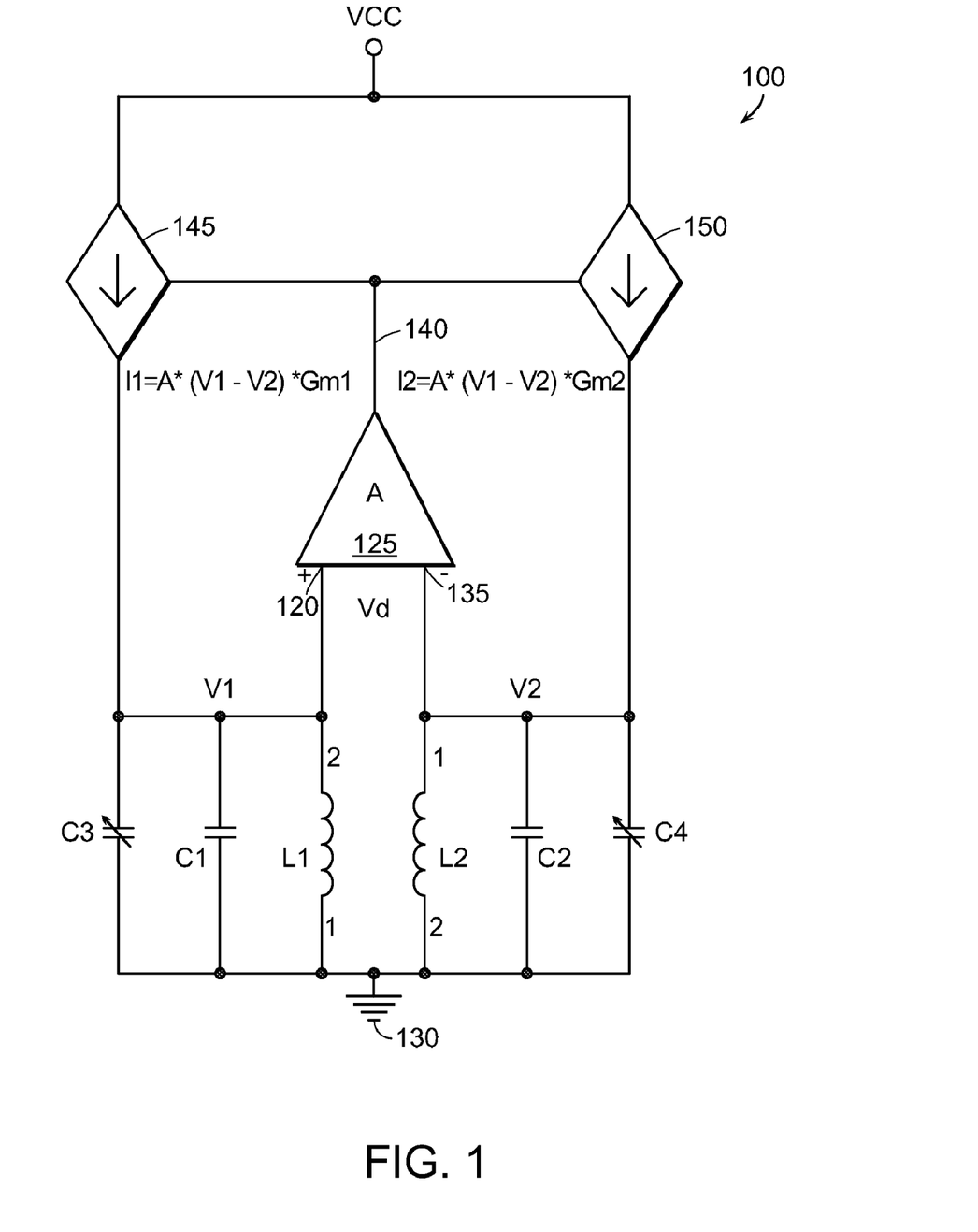
FIG. 1 is a block diagram of a differential oscillator for an inductive proximity sensor according to an example embodiment of the present invention.

FIG. 1 is a block diagram of a differential oscillator 100 for an inductive proximity sensor (not shown) according to an example embodiment of the present invention. The inductive proximity sensor employs an electrical coil to generate an alternating current (AC) magnetic field around the sensing face of the sensor and can sense or detect position and presence of a metal target in various industrial applications. The AC magnetic field induces an eddy current in any metallic material positioned in the magnetic filed. The eddy current consumes field energy and generates a secondary field to counter the field generated by the electrical coil (i.e., primary field). These influences from the metallic material are detected through the primary coil and processed by the electronic circuit to produce a sensor output to indicate the position or presence of the metallic target.

The inductive proximity sensor employs a differential oscillator including two inductor-capacitor (LC) tank circuits to sense metallic targets positioned at various sensing distances.

The differential LC oscillator 100 includes a first inductor-capacitor tank circuit, including inductor $L_1$ and capacitor $C_1$, connected between a non-inverting input 120 of a differential amplifier 125 and ground 130. The differential LC oscillator also includes a second LC tank, including inductor $L_2$ and capacitor $C_2$, connected between an inverting input 135 of the differential amplifier 120 and ground 130. The output voltage of the differential amplifier 140 controls two voltage-controlled-current-sources $I_1$ and $I_2$, which, in turn, pump a current into their corresponding LC tanks. Specifically, the first LC tank, including inductor $L_1$ and capacitor $C_1$, receives its current from voltage-controlled-current-source $I_1$, and the second LC tank, including inductor $L_2$ and capacitor $C_2$, receives its current from voltage-controlled-current-source $I_2$.

The closed loop differential oscillator 100 includes an LC oscillator, with the first LC tank (including $L_1$ and $C_1$) functioning as its frequency selection network. The oscillation amplitude of the differential oscillator 100 is determined based on a voltage difference between the first and the second LC tanks, $V_d$. This voltage difference may be obtained as follows:

$$V_d = V_1 - V_2,$$

where $V_1$ denotes the voltage across the first LC tank and $V_2$ denotes the voltage across the second LC tank. Since the voltage $V_d$ is determined as a function of amplitude and phase differences of the voltages across the first and second LC tanks (i.e., $V_1$ and $V_2$), the oscillator may be arranged to run at a low voltage by tuning $L_1C_1$, and $L_2C_2$ to be relatively close to one another.

The first and second LC tanks may be tuned using at least one of variable capacitor C3 or C4. The variable capacitors C3 or C4 may be implemented by using a variable capacitance diode (e.g., varactor) whose capacitance can be adjusted through a DC voltage. The variable capacitors C3 or C4 may alternatively be adjusted using a Miller capacitor whose capacitance can be controlled by a variable amplifier gain.

Since the voltage difference between the first and the second LC tanks, Vd is determined as a function of both the amplitude and phase differences between V1 and V2, when the first and second LC tanks, $L_1C_1$, and $L_2C_2$ are tuned to be relatively close to each other, a Vd signal keeps the oscillator running at a low voltage level.

As shown in FIG. 1 the currents $I_1$, and $I_1$, may be obtained as follows:

$$I_1 = A*(V_1-V_2)*Gm_1 \text{ and}$$

$$I_2 = A*(V_1-V_2)*Gm_2,$$

where $Gm_1$ and $Gm_2$ denote the transconductance of $I_1$ and $I_2$, respectively.

Figure 2:
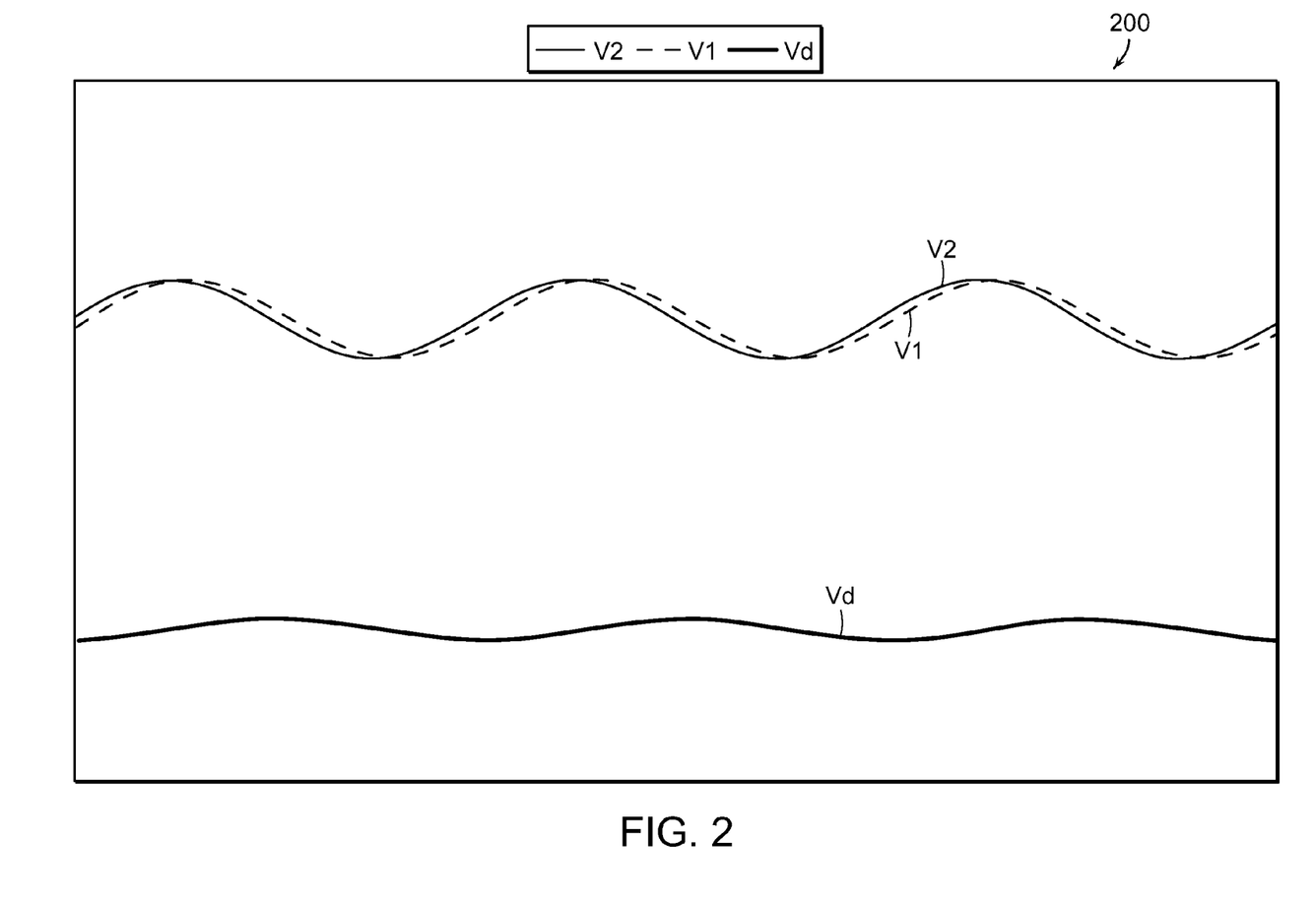
FIG. 2 illustrates plots of voltage waveforms of a differential oscillator obtained in absence of metallic target, using the inductive proximity sensor described according to an example embodiment of the present invention.

FIG. 2 illustrates plots 200 of voltage waveforms, $V_1$, $V_2$, and $V_d$, of the differential oscillator 100 shown in FIG. 1. These plots were obtained in absence of a metallic target (not shown), using an inductive proximity sensor (not shown) described according to an example embodiment of the present invention. As described above, the $V_d$ is determined based on the voltage difference between the first and second LC tanks. Therefore, when the voltages of the LC tanks $V_1$, $V_2$ are tuned to be close to one another, the oscillator runs at a low voltage level $V_d$.

Figure 3:
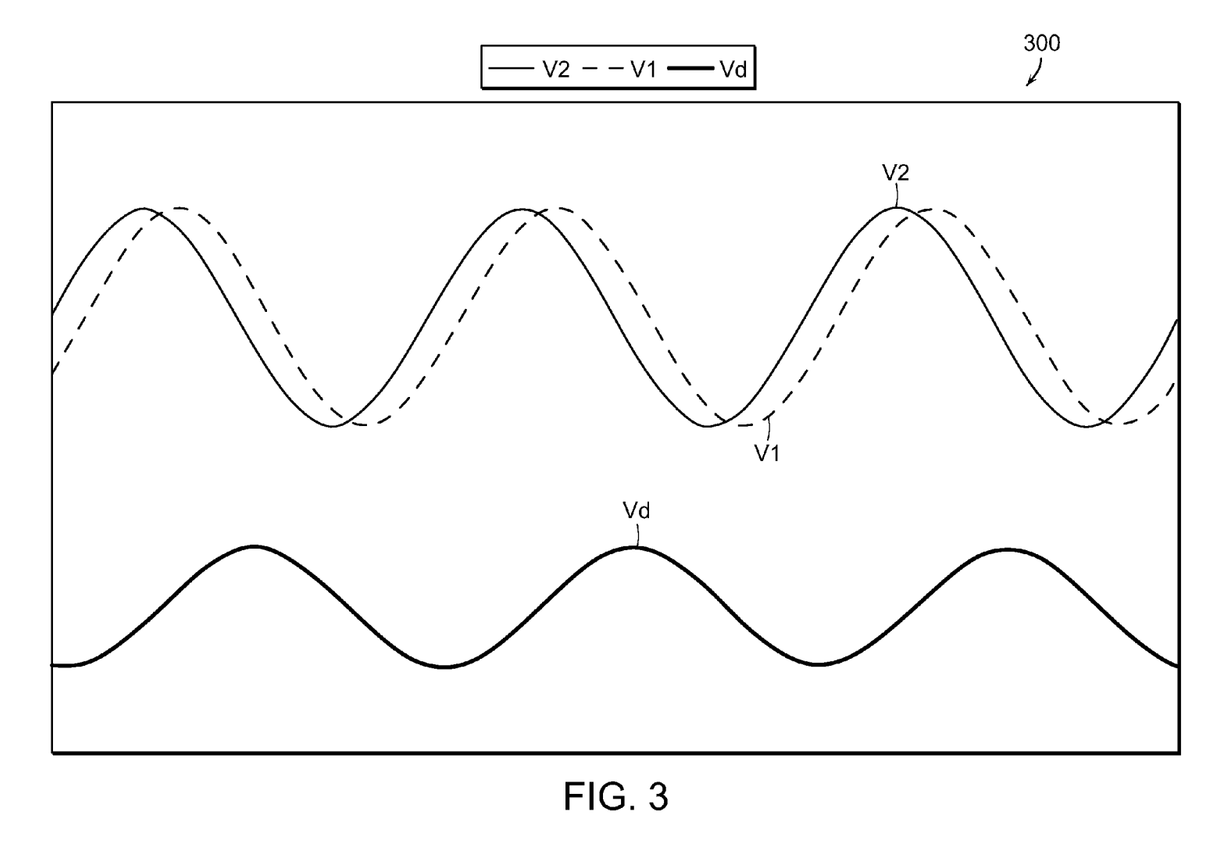
FIG. 3 illustrates plots of voltage waveforms of a differential oscillator obtained in presence of a metallic target, using the inductive proximity sensor described according to an example embodiment of the present invention.

FIG. 3 illustrates plots of voltage waveforms 300, $V_1$, $V_2$, and $V_d$ of the differential oscillator 100 shown in FIG. 1. These plots were obtained in presence of a metallic target (not shown) using an inductive proximity sensor (not shown) described according to an example embodiment of the present invention. The quality factors of the inductors $L_1$ or $L_2$ (each of which may be a sensing coil) is influenced as a metallic target approaches the sensing coils. The approaching metallic target may also result in changes in relative phase differences between first and second LC tanks and in the oscillation amplitude of the differential oscillator 100. A down-stream signal processing circuit may be used to detect this oscillation amplitude or phase change and convert the change in oscillation amplitude or phase into an output signal that indicates the presence or position of the target.

Figure 4:
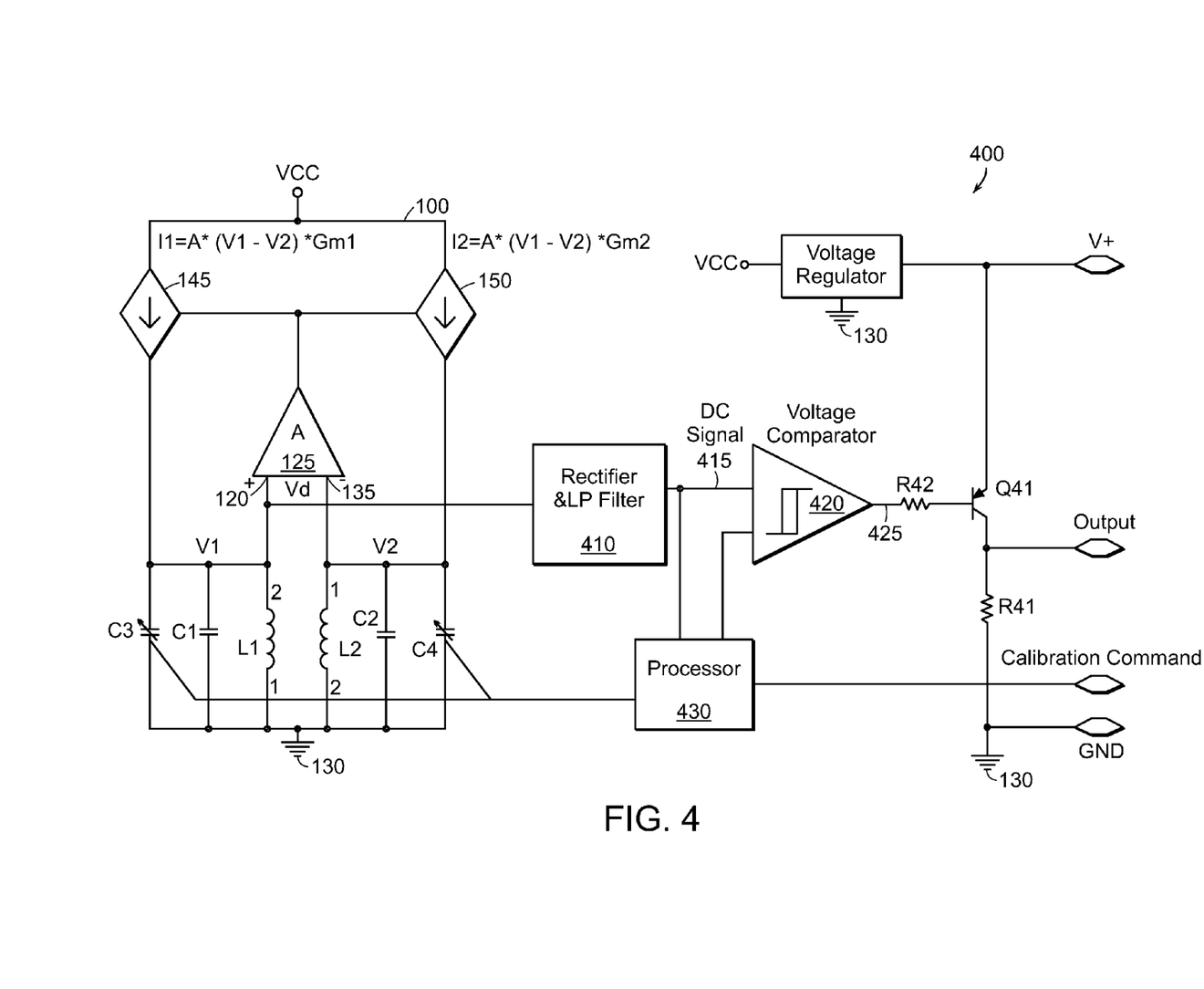
FIG. 4 is a block diagram of an inductive proximity sensor according to an example embodiment of the present invention.

FIG. 4 is a block diagram of an inductive proximity sensor 400 according to an example embodiment of the present invention. The proximity sensor 400 includes a differential oscillator 100 (shown in FIG. 1) and employs a rectifier and low pass filter 410 to convert the oscillation signal $V_1$ (or $V_2$) into a direct current (DC) signal 415. The DC signal 415 is fed into an input of a voltage comparator 420. A processor 430 (e.g., a microcontroller) is used to tune the first and second LC tanks. The processor 430 also provides the comparator 420 with a decision making threshold. The comparator output 425 controls the sensor output to switch on when a metallic target (not shown) moves within a sensing distance of the sensor 400.

Figure 5:
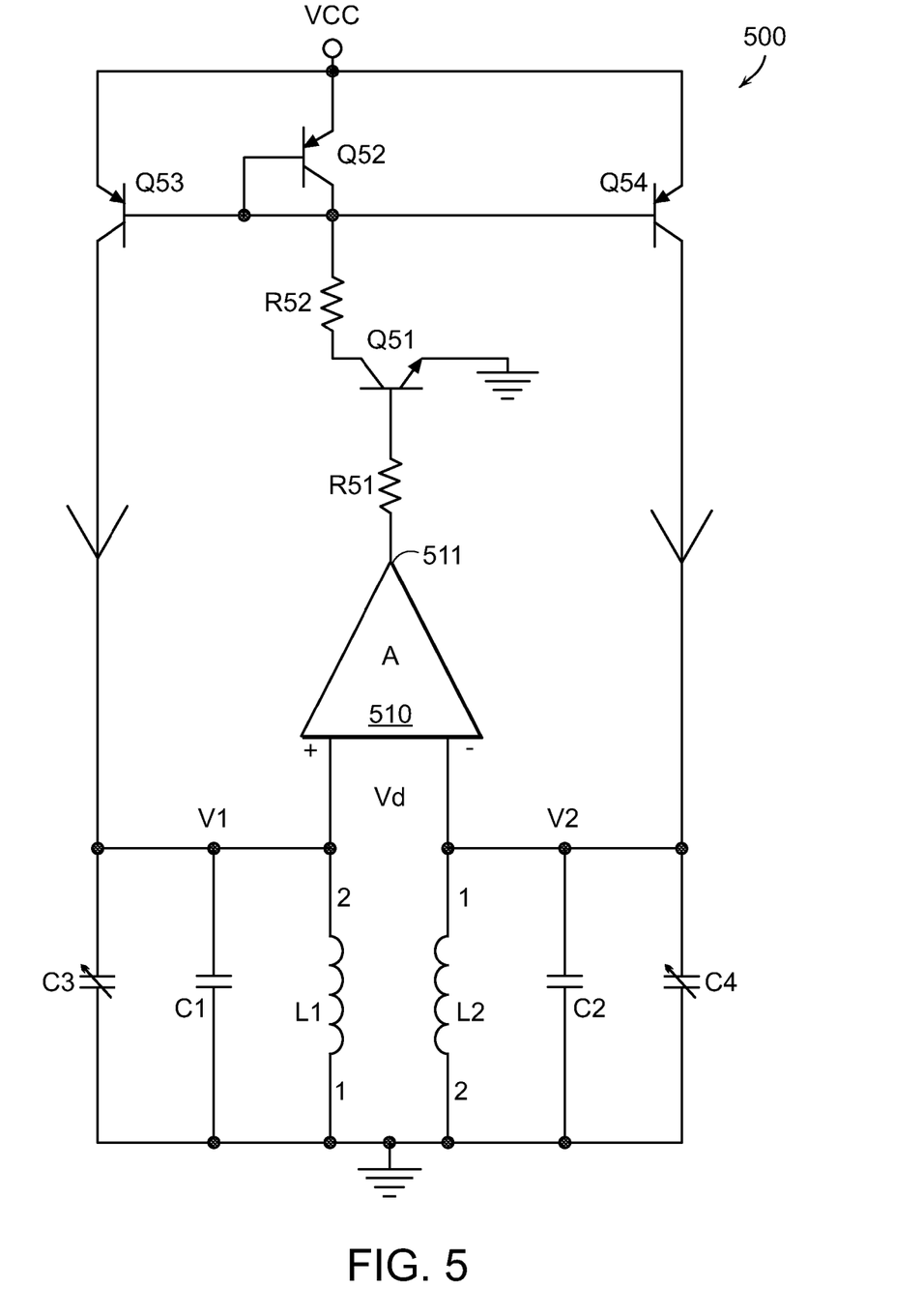
FIG. 5 is an illustration of a differential oscillator according to an example embodiment of the present invention.

FIG. 5 is an illustration of a differential oscillator 500 according to an example embodiment of the present invention. In this example embodiment, the differential oscillator 500 includes a first LC tank including an inductor $L_1$ and a capacitor $C_1$. The oscillator 500 also includes a second LC tank including an inductor $L_2$ and a capacitor $C_2$. The first and second LC tanks are connected to a differential amplifier 510, whose output 511 controls a current flowing to a resistor R52 through a resistor R51 and a transistor Q51. The differential amplifier 510 directs this current into the first and second LC tank circuits through current mirrors comprising transistors Q52, Q53, and Q54.

Figure 6:
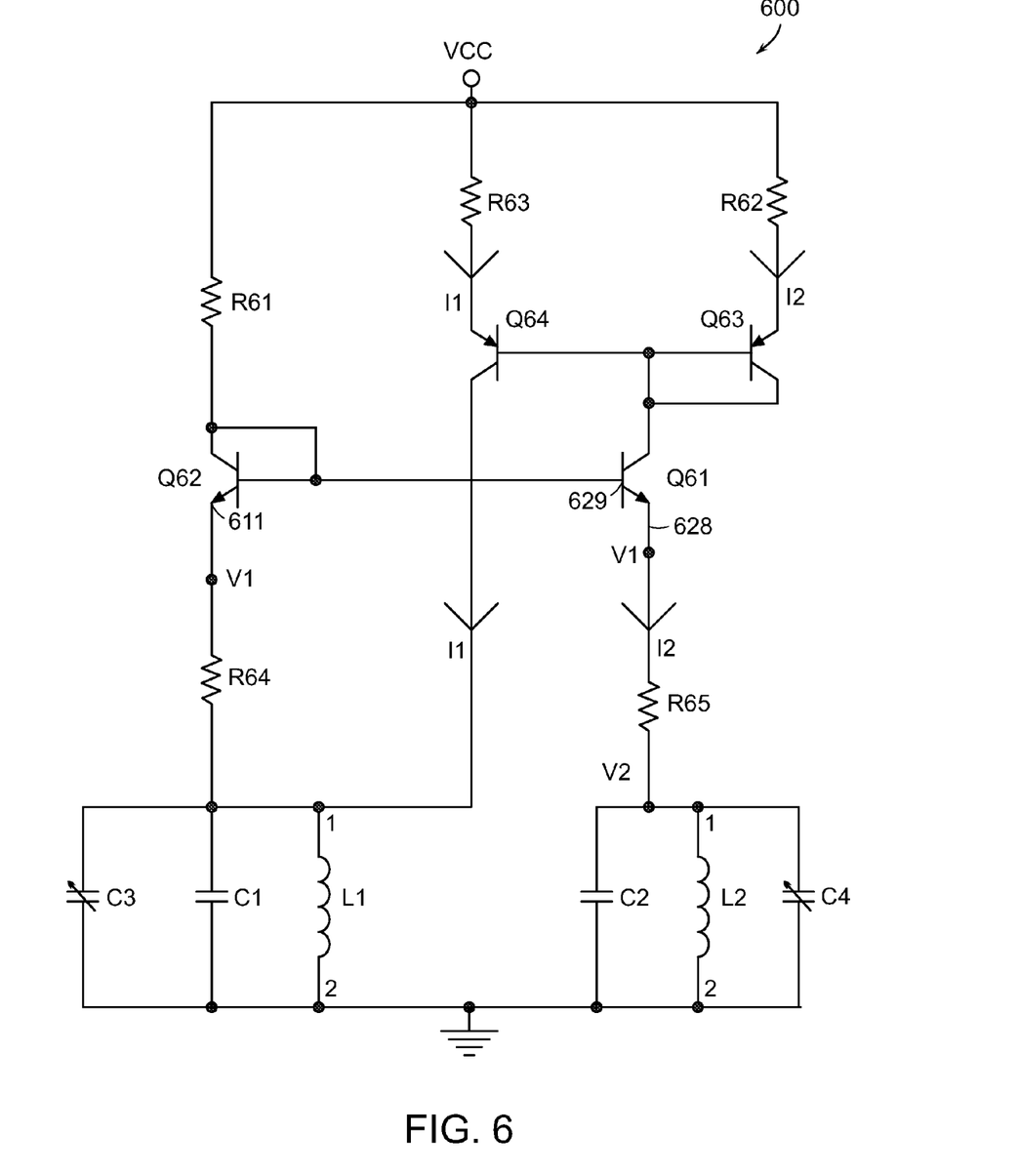
FIG. 6 is an illustration of a differential oscillator including a simple transistor circuit according to an example embodiment of the present invention.

FIG. 6 is an illustration of an example embodiment of the present invention for a differential oscillator 600 that includes a simple transistor circuit. The differential oscillator 600 includes a transistor Q62 and a resistor R61, used to provide a base biasing for transistor Q61. An AC Voltage V1 across a first LC tank (including an inductor $L_1$ and a capacitor $C_1$) is transferred to the emitter 611 of the transistor Q62 through a resistor R64 and to a base 629 of the transistor Q61. An emitter 628 of the transistor Q61 follows the base 629 of the transistor Q61. The differential oscillator 600 also includes a second LC tank (including an inductor $L_2$ and a capacitor $C_2$). The AC voltage across the second LC tank is labeled as V2. As shown in FIG. 6, under the setup described above, the voltage across the resistor labeled as R65 equals V1−V2.

In this example embodiment, a current $$I_2\left(I_2 = \frac{V_1 - V_2}{R_{65}}\right)$$

is pumped into the second LC tank. The same current flows through the emitter 628 of the transmitter Q61. The example embodiment assumes that all transistors involved have a high current gain and as such the effects of their base currents is minimal and may be ignored compared with their corresponding emitter and collector currents. Therefore, the example embodiment assumes $I_{collector}=I_{emitter}$ for all transistors involved in the differential oscillator 600. As such, it may be assumed that the same current $I_2$ flows through emitters and collectors of the transistors Q61 and Q63. Additionally, transistors Q63 and Q64 and resistors R62 and R63 form a current mirror, such that $I_1*R_{63}=I_2*R_{62}$ or equivalently $$I_1 = \left(\frac{R_{62}}{R_{63}}\right)*I_2.$$

Clearly, when $R_{63}=R_{62}$, $I_1=I_2$. The mirrored current $I_1$ of $I_2$ is pumped into the first LC tank.

When compared with circuit in FIG. 1, it can be easily recognized that the voltage gain of the differential amplifier A=1 and trans-conductance of the VCCS $$Gm_1 = Gm_2 = \frac{1}{R_{65}}.$$

Similar to the differential oscillator 100 shown in FIG. 1, the oscillation of the differential oscillator 600 is maintained using a voltage difference $V_d=V_1-V_2$. Variable capacitors C3 and C4 may be used to tune the resonance frequencies of the first and second LC tanks to ensure that the oscillation is maintained using a small voltage difference $V_d$ in absence of a metallic target in the sensor vicinity. The oscillation voltage $V_d$ increases once a metallic target enters the magnetic field created by the sensor.

In a preferred embodiment the inductor $L_2$ includes a sensing coil (e.g., Printed Circuit Board (PCB) trace) and the inductor $L_1$ includes a chip inductor that is not normally influenced by the target. The capacitor $C_1$ is tuned to make the product of $L_1*C_1$ slightly larger than the product of $L_2*C_2$, and let the differential oscillator run at a relatively high frequency (e.g., around 1-2 Mega Hertz) but at a relatively low voltage amplitude level.

The inductance of the sensing coil $L_2$ decreases as a metallic target approaches its vicinity. The amount of decrease in the inductance of the sensing coil of $L_2$ is nearly the same for both ferrous and non-ferrous metallic targets at high frequencies. This decrease in the value of inductance of $L_2$ increases the phase difference between voltages V1 and V2 such that the amplitude of $V_d=V_1-V_2$ increases, resulting in an increase in the oscillation amplitude. The increased amplitude may be detected using a down-stream signal processing circuit (not shown) that controls the output of the sensor. In one embodiment, the down-stream circuit may be implemented using a rectifier and LP filter 410, voltage comparator 420, and processor 430, as shown in FIG. 4. Accordingly, the example embodiment can achieve similar sensing distances for both ferrous and non-ferrous metallic targets.

The proximity sensor of this example embodiment is highly sensitive to inductance changes of its sensing coil(s). The inductance changes of the differential oscillator are also highly resistant to changes in temperature. As such, the proximity sensor of this example embodiment can achieve long sensing distances for both ferrous and non-ferrous targets. Additionally, since the oscillator amplitude is arranged to only increase when a target is approaching the sensor vicinity, the oscillator never collapses, resulting in very high switching frequency of the sensor. When an oscillator collapses (e.g., when the amplitude drops to zero), it may take a long period of time for the oscillator to recover and be able to sense a target again. This can increase the response time of a sensor and reduce the switching frequency of the sensor. Further, since the example embodiment does not employ a ferrite core in its implementation of the proximity sensor, it achieves high levels of immunity to outside magnetic fields.

In one example embodiment, the inductor and capacitor of the first LC tank, $L_1C_1$, may be chosen to ensure that the oscillation frequency is below a critical frequency. This critical frequency is the frequency at which a ferrous target entrance into the vicinity of the sensor results in an increase in inductance $L_2$ of a sensing coil and a non-ferrous target entrance into the vicinity of the sensor results in a decrease in inductance $L_2$ of a sensing coil.

In this example embodiment, the value of $L_1*C_1$, is tuned to be the same as the value of $L_2*C_2$ except that $L_1*C_1$, is arranged to have a higher quality factor. In absence of a target in the vicinity of the sensor, there is no phase difference between the LC tank voltages $V_1$ and $V_2$. However, since the first LC tank, $L_1C_1$, has a higher quality factor than the second LC tank, $L_2C_2$, the oscillator may be arranged to oscillate at a relatively low amplitude.

Accordingly, when a ferrous target enters the proximity sensor vicinity, the phase of V1 leads the phase of V2, and when a non-ferrous target enters the proximity sensor vicinity, the phase of V1 lags the phase of V2.

Figure 7:
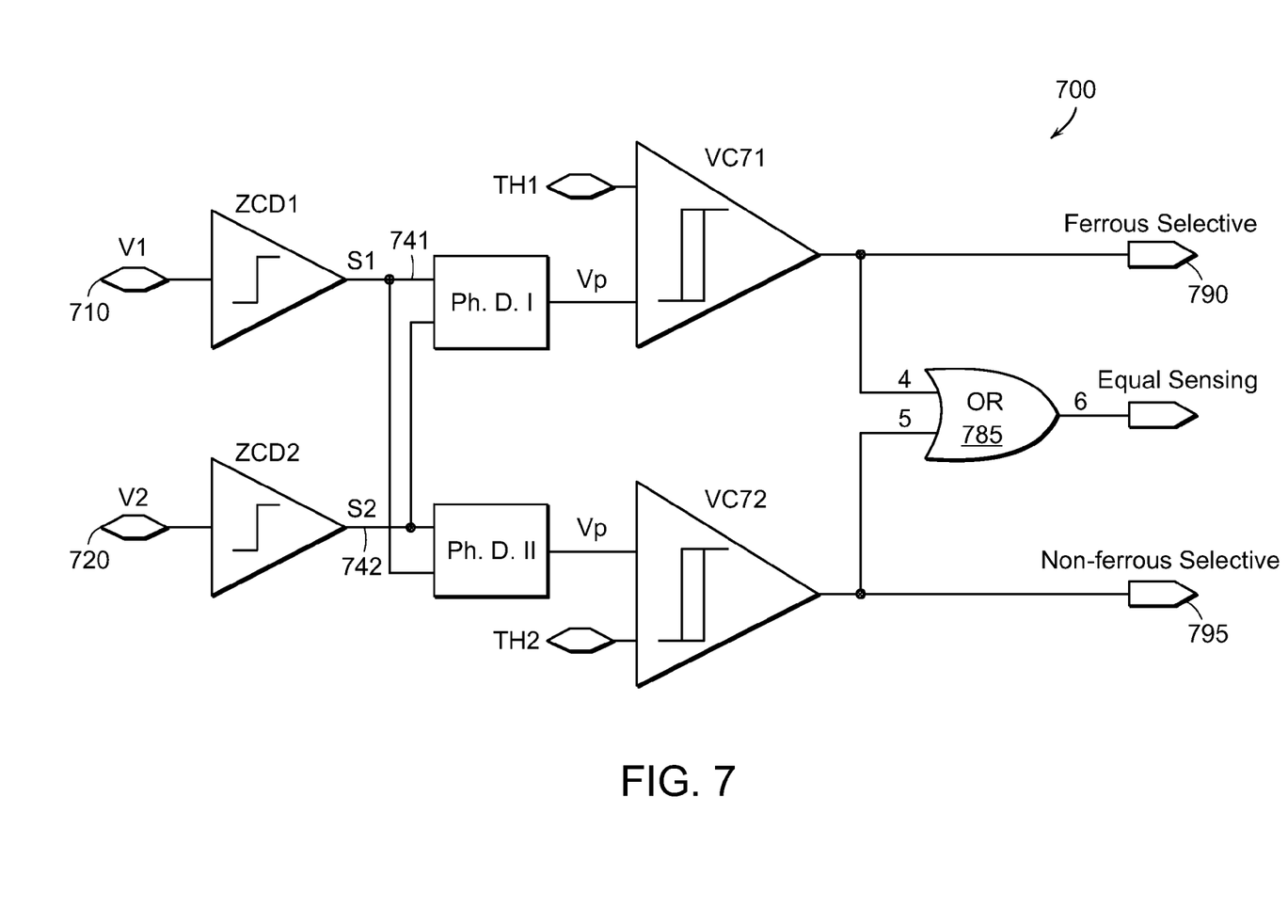
FIG. 7 is a block diagram of a phase detection and decision making circuit employed in an inductive proximity sensor according to an example embodiment of the present invention.

FIG. 7 is a block diagram of a phase detection and decision making circuit 700 employed in an inductive proximity sensor (not shown) according to an example embodiment of the present invention. The phase detection and decision making circuit 700 generates a signal that may be used to control an output of the sensor. The phase detection and decision making circuit 700 converts the voltages V1 and V2 into corresponding square waves S1 and S2 using two zero crossing detection circuits (ZCD1 and ZCD2 respectively). The square waves S1 and S2 are fed into leading phase detector circuits, Ph.D.I and Ph.D.II respectively, to generate analog signals proportional to the leading phases. Once the output of the leading phase detector circuit Ph.D.I reaches a first pre-set threshold, the ferrous output 790 changes its state to indicate the presence of a ferrous target. Similarly, when the output of the leading phase detector circuit Ph.D.II reaches a second pre-set threshold, the non-ferrous output 795 changes its state to indicate the presence of a non-ferrous target.

The first and second threshold levels may be adjusted at different values to ensure that the proximity sensor can achieve similar sensing distances for both ferrous non-ferrous targets. A logical OR gate 785 may be employed to logically combine the outputs of the leading phase detector circuits to achieve all metal equal sensing function.

The phase detection and decision making circuit 700 also includes at least two voltage comparators, VC71 and VC72. Threshold levels (TH1 and TH2) for the voltage comparators are chosen to compensate for phase shift difference caused by ferrous and non-ferrous targets. By compensating for the phase shift difference, the phase detection and decision making circuit 700 ensures that equal sensing distances for both ferrous and non-ferrous objects are achieved.

Figure 8:
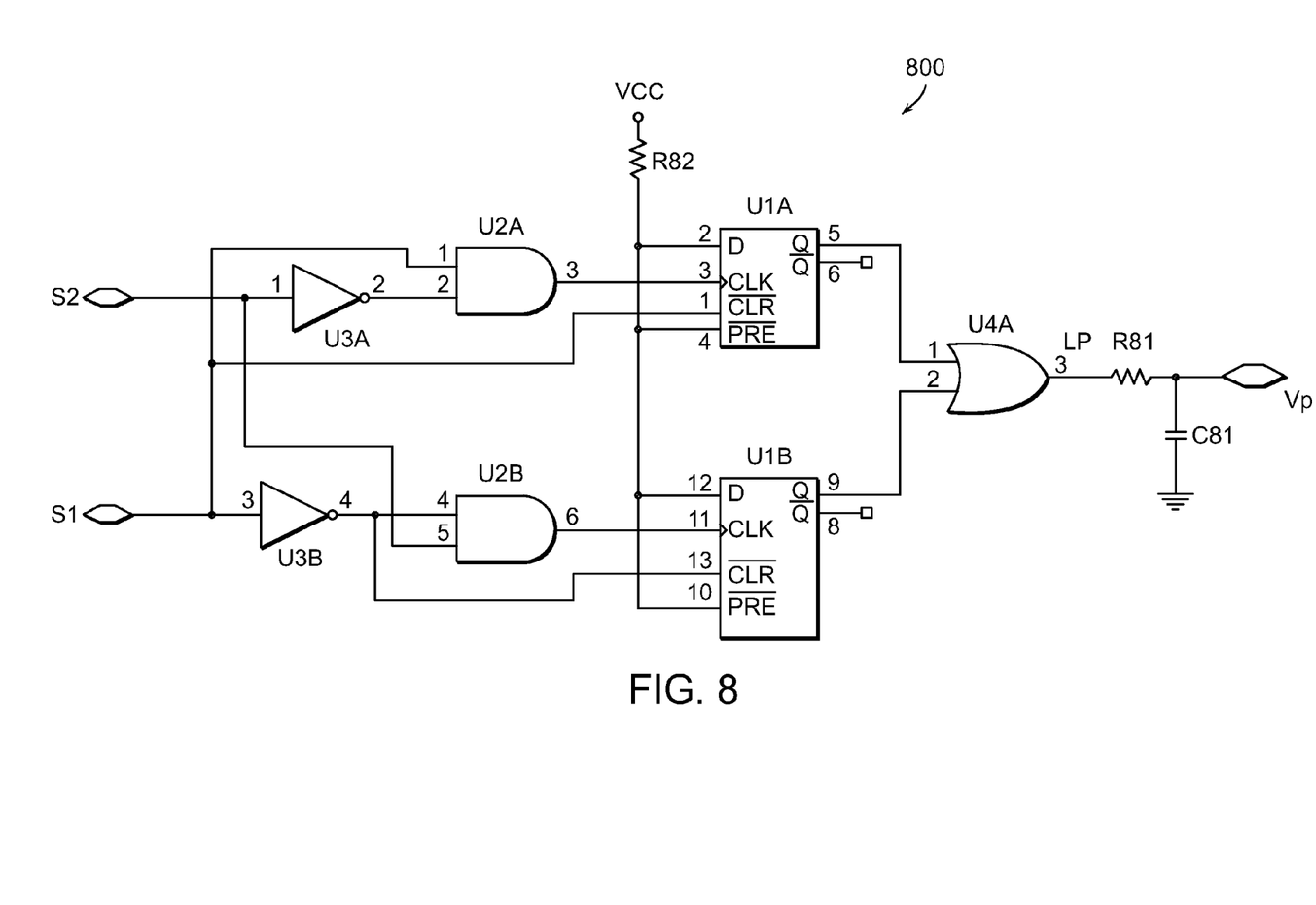
FIG. 8 is a schematic of a leading phase detection circuit according to an example embodiment of the present invention.

FIG. 8 is a schematic of a leading phase detection circuit 800 (Ph.D.) according to an example embodiment of the present invention. The leading phase detection circuit 800 includes a pair of D-type flip-flops U1A and U1B, a pair of AND gates U2A and U2B, a pair of logic inverters U3A and U3B, an OR gate U4A, as well as a low pass filter including a resistor R81 and a capacitor C81. The Ph.D. circuit 800 is designed to ensure that the output responds only when input signal S2 leads input signal S1 in phase. Otherwise the output signal would be set at zero. The Ph.D. circuit 800 employs a pull-up resistor R82, connected to supply voltage Vcc, to provide a logic "1" to the pins connected to the pull-up resistor.

Figure 9:
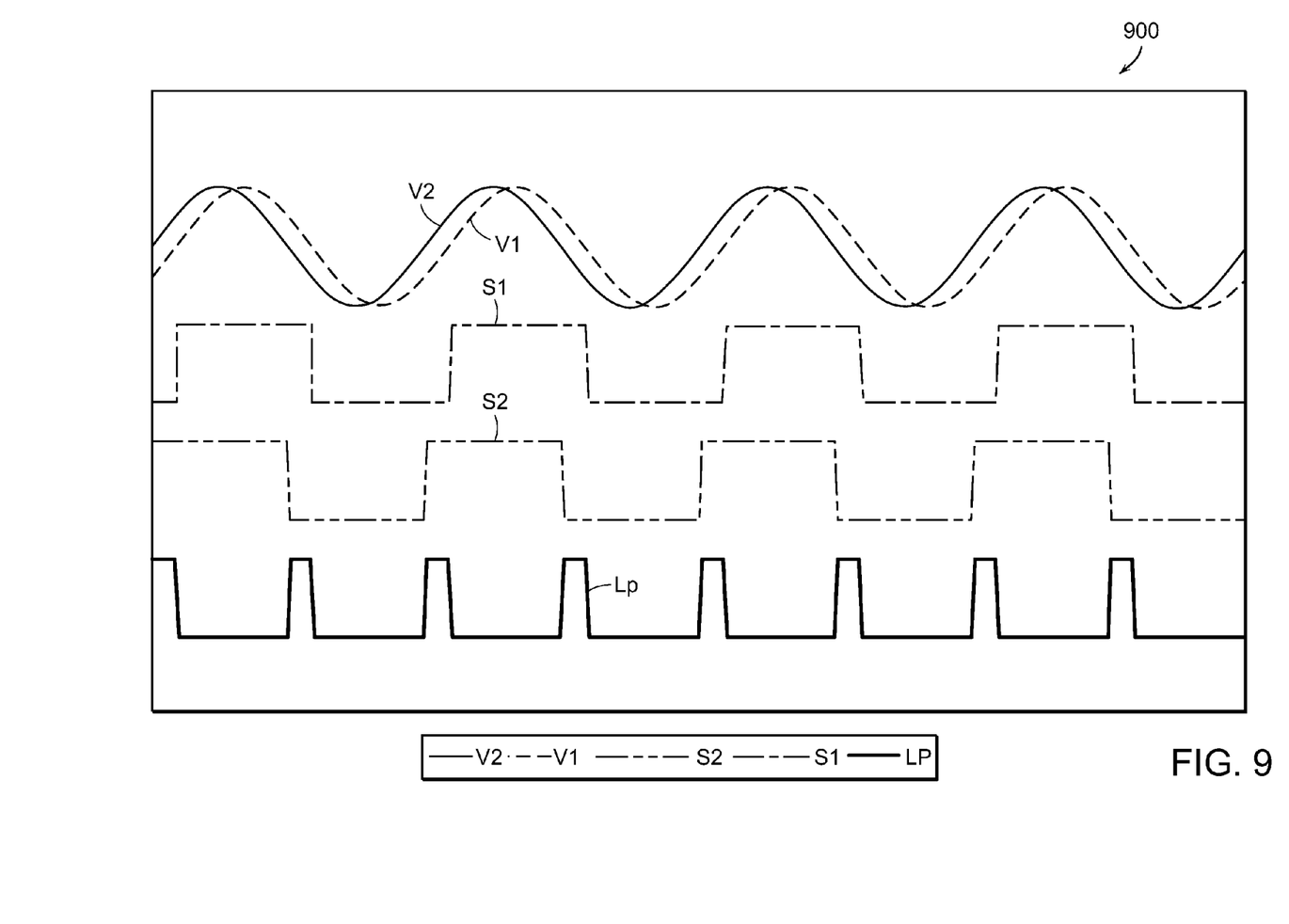
FIG. 9 is a diagram of waveforms associated with phase detection and decision making circuit shown in FIGS. 7 and 8.

FIG. 9 is a diagram of waveforms associated with phase detection and decision making circuit shown in FIGS. 7 and 8. Specifically, the waveforms V1, V2, S1, and S2, as well as the leading phase logic output LP when S2 leads S1 (i.e., V2 leads V1) are illustrated. When S2 lags S1 (i.e. V2 lags V1) LP remains zero.

Figure 10:
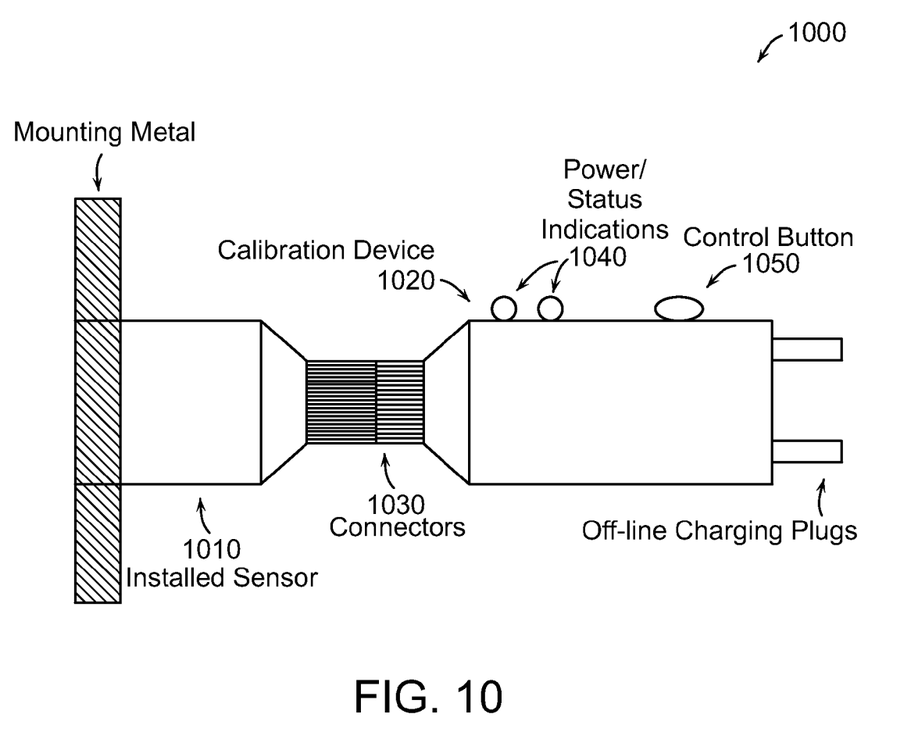
FIG. 10 is an illustration of a calibration device according to an example embodiment of the present invention.

FIG. 10 is an illustration of a calibration method 1000 for use in an example embodiment of the present invention. The calibration method 1000 includes a calibration device 1020 that is connected to a sensor 1010 through connectors or cables 1030 (the connection type may vary depending on the sensor). In operation, the calibration device 1020 sends a series of command pulses to a command input of the sensor 1010 signaling the start of a calibration process. The calibration process compensates for possible influences of sensor mounting conditions. The sensor calibration device 1020 is electrically engaged with the sensor 1010 and a calibration command is sent to the sensor 1010. In response to the calibration command, the sensor 1010 is calibrated under the control of a residing program within the memory of the sensor. The calibration device 1020 also provides the sensor with power and includes control buttons and a status display.

The command pulses include a series of logic signals with predetermined lengths. In order to prevent calibration errors, the command pulses need to be complex enough not to be mistaken with random noise. The calibration is done within the sensor 1010 and as a function of adjustments made to sensor variables such as oscillator or amplifier gain, system sensitivity, frequency or phase, trip level, and etc. to eliminate the influence of surrounding mounting metal. For example, in order to calibrate the proximity sensor shown in FIG. 4, the calibration device 1020 may adjust at least one of capacitor C3 or capacitor C4. The calibration may be completed almost instantly. The calibration device 1020 may also include one or more indicators 1040 (e.g., LED indicators) used to demonstrate the status of the calibration. For example, the indicators 1040 may indicate whether the calibration process has been successfully completed or failed. A failed calibration may be caused by improper installation or as a result of sensing face blockage (e.g., by metal shavings).

Figure 11:
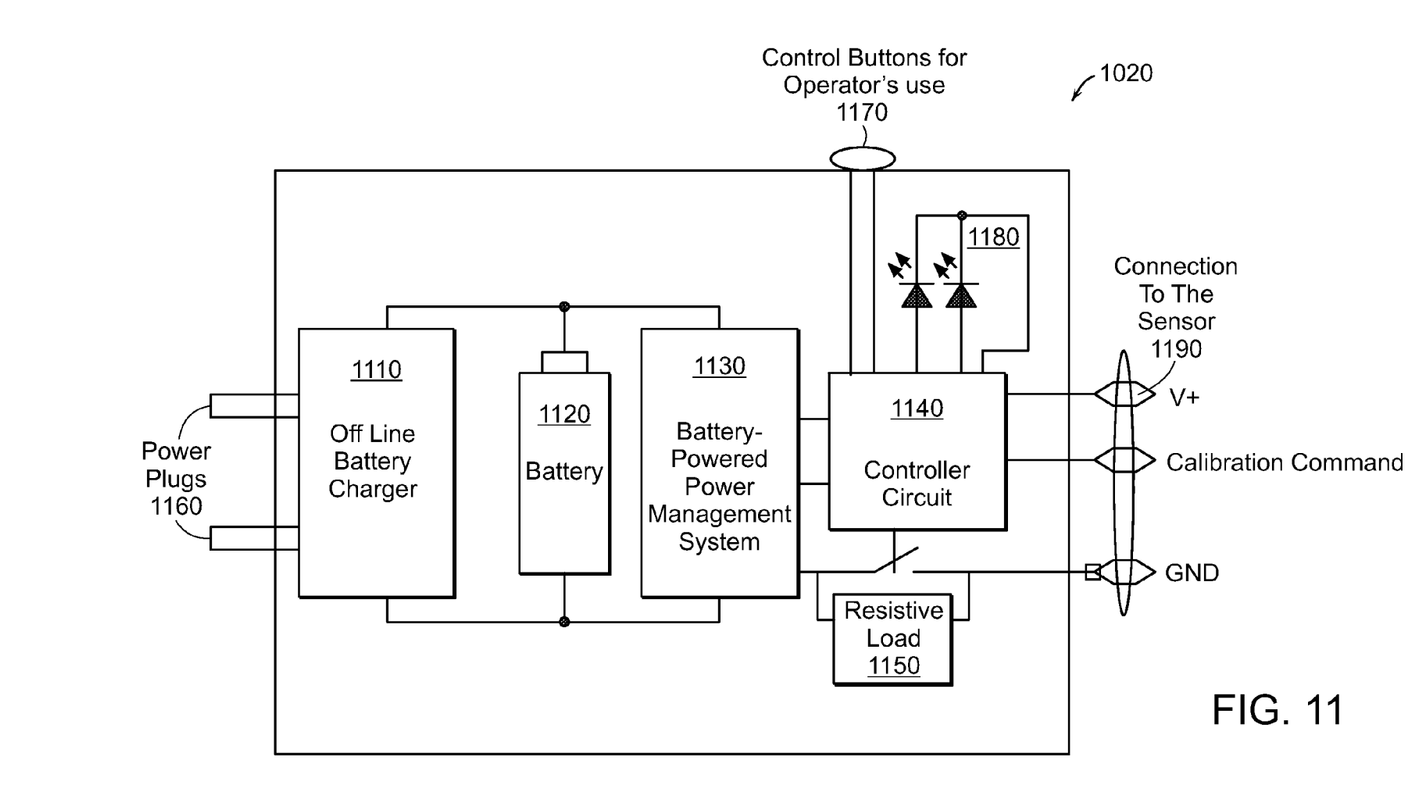
FIG. 11 is a high level illustration of a calibration device according to an example embodiment of the present invention.

FIG. 11 is an illustration of an example embodiment of the calibration device 1020 illustrated in FIG. 10.

The calibration device 1020 includes a battery 1120 that may be disposable or rechargeable. If a rechargeable battery is used, the off-line battery charger 1110 is used to charge the battery. The off-line battery charger 1110 employs power plugs 1160 to charge the battery if/when a chargeable battery is used.

The calibration device 1020 also includes a battery-powered power management circuit 1130 used to power up both the electronics of the calibration device and the installed sensor (i.e., sensor to be calibrated). The power management circuit 1130 regulates and manages power from the battery 1120. The power management circuit 1130 may be implemented using a step-up switching voltage regulator circuit or commercially available battery power management module. This circuit provides supply voltages for a controller circuit 1140 as well as for the sensor under calibration.

The controller circuit 1140 also sends command pulses to the sensor and may be implemented using a microcontroller circuit or a digital circuit such as a programmable logic array integrated circuit. The controller circuit 1140 receives control information from control buttons 1050 (shown in FIG. 10) and sends calibration command pulses to the sensor under calibration. The circuit 1140 may also send calibration device status messages to one or more displays 1040 (shown in FIG. 10). This circuit 1140 may also provide control and signal processing capability for the power management circuit 1130.

The calibration device 1020 may also include a housing or case to hold the electronics, one or more control buttons 1170 on the housing for an operator's use in starting the calibration process, one or more displays (e.g., LED display) 1180 on the housing to indicate the status of the calibration, and a connector 1190 to connect the calibration device to the sensor.

A resistive load 1150 may be used to calibrate a two wire AC/DC sensors. In this case the load will be connected in series with the sensor through control of the controller circuit 1140.

Figure 12:
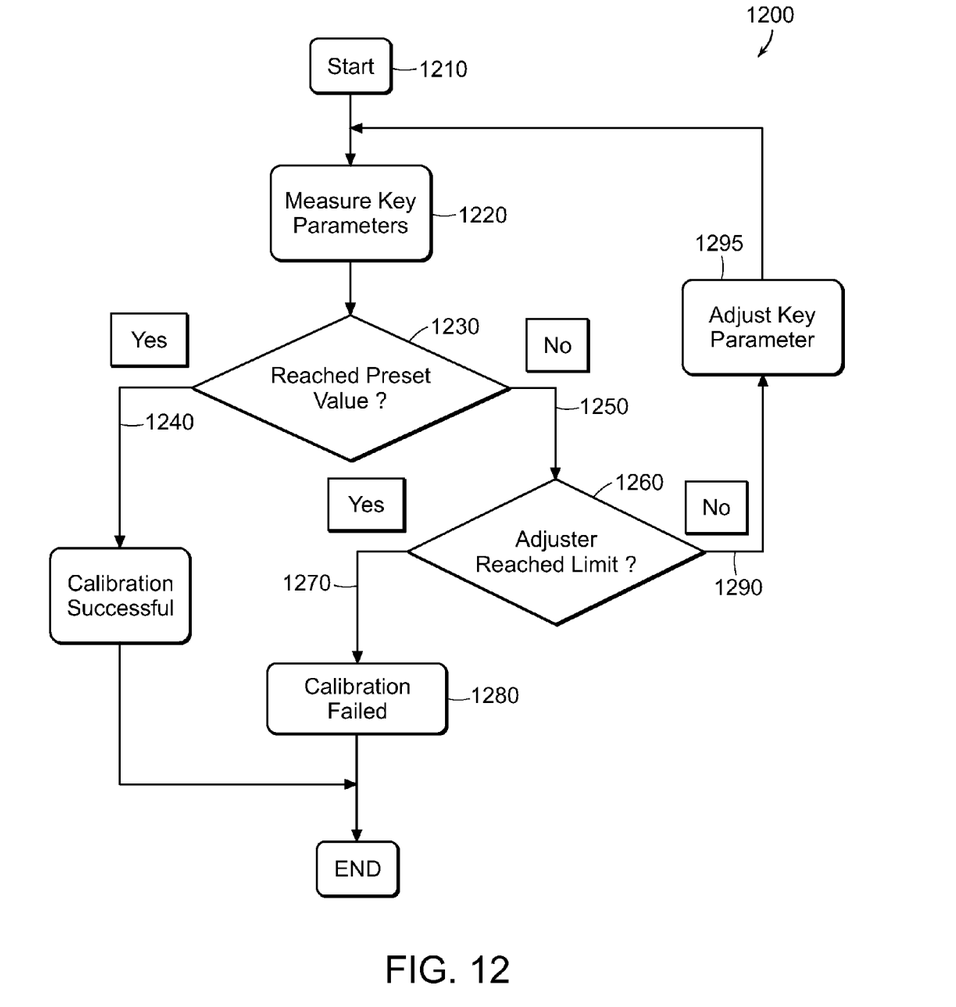
FIG. 12 is a flow diagram of a calibration routine stored in an inductive proximity sensor memory according to an example embodiment of the present invention.

FIG. 12 is a flow diagram 1200 of a calibration routine stored in an inductive proximity sensor memory according to an example embodiment of the present invention. The calibration routine starts 1210 once a sensor receives a calibration command from the calibration device. Key parameters are measured 1220, the key parameters may be factors such as oscillation amplitude or phase signal. The calibration routine 1230 determines if a preset no target value is reached. If the preset target value is reached 1240, no further adjustment is required and calibration is completed successfully. If the preset target value is not reached 1250, the calibration routine proceeds to determine if an adjuster (e.g., a variable capacitor) has reached its limit 1260. If the adjuster has reached its limit 1270 no further adjustment can be done and calibration is said to have ended in failure 1280. If the adjuster has not reached its limit 1290, the adjuster will be incremented by one step 1295.

While this invention has been particularly shown and described with references to example embodiments thereof, it will be understood by those skilled in the art that various changes in form and details may be made therein without departing from the scope of the invention encompassed by the appended claims.

What is claimed is:

1. An inductive proximity sensor comprising:
   an oscillator including a first inductor-capacitor circuit and a second inductor-capacitor circuit, an inductance of one of the inductor-capacitor circuits having substantially greater sensitivity to an external target than an inductance in the other inductor-capacitor circuit; and
   an alternating current drive to each of the inductor-capacitor circuits, the drive to the inductor-capacitor circuits being in-phase and depending on difference in voltages across the inductor-capacitor circuits.

2. The inductive proximity sensor of claim 1 wherein the voltage difference is applied to a differential amplifier that controls currents flowing through each of the inductor-capacitor circuits.

3. The proximity sensor of claim 1 further including a signal processing circuit that indicates presence and position of the external target as a function of detecting amplitude changes caused by the external target in voltages across at least one of the first and second inductor-capacitor circuits.

4. The inductive proximity sensor of claim 1 further comprising at least one phase detector that identifies a ferrous target or a non-ferrous target as a function of determining a leading phase from among voltages across the inductor-capacitor circuits.

5. The inductive proximity sensor of claim 4 wherein the at least one phase detector identifies a ferrous target or a non-ferrous target in an event the leading phase reaches a predetermined threshold.

6. The inductive proximity sensor of claim 1 wherein the voltage difference controls current in a current mirrored circuit that controls current to each of the inductor-capacitor circuits.

7. The inductive proximity sensor of claim 1 wherein the inductor having lesser sensitivity to the external target provides a positive feedback in the oscillator.

8. The inductive proximity sensor of claim 1 wherein the inductor-capacitor circuit of greater sensitivity to an external target is of a coil and the inductance of lesser sensitivity is of an inductor.

9. The inductive proximity sensor of claim 1 further comprising a variable capacitor coupled to at least one of the inductor-capacitor circuits, the variable capacitor tuning the inductor-capacitor circuits to approximately same resonant frequencies.

10. The inductive proximity sensor of claim 1 further including a voltage control module that controls voltage across each of the inductor-capacitor circuits as a function of controlling current flowing to each of the inductor-capacitor circuits.

11. The proximity sensor of claim 1 wherein the first inductor-capacitor circuit is arranged between a non-inverting input of a differential amplifier and ground and the second inductor-capacitor circuit is arranged between an inverting input of the differential amplifier and ground.

12. The proximity sensor of claim 1 wherein at least one of the first and second inductor-capacitor circuits includes a sensing coil.

\* \* \* \* \*